(12) United States Patent
Lee et al.

(10) Patent No.: US 9,401,456 B2
(45) Date of Patent: Jul. 26, 2016

(54) LIGHT-EMITTING DIODE WITH IMPROVED LIGHT EXTRACTION EFFICIENCY

(71) Applicant: Seoul Viosys Co., Ltd., Ansan-si (KR)

(72) Inventors: Jin Woong Lee, Ansan-si (KR); Kyoung Wan Kim, Ansan-si (KR); Yeo Jin Yoon, Ansan-si (KR); Ye Seul Kim, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/740,131

(22) Filed: Jun. 15, 2015

(65) Prior Publication Data

US 2015/0280074 A1  Oct. 1, 2015

Related U.S. Application Data

(63) Continuation-in-part of application No. PCT/KR2013/011459, filed on Dec. 11, 2013.

(30) Foreign Application Priority Data

Dec. 14, 2012 (KR) .................. 10-2012-0146772

(51) Int. Cl.
| | |
|---|---|
| *H01L 33/42* | (2010.01) |
| *H01L 33/38* | (2010.01) |
| *H01L 33/22* | (2010.01) |
| *H01L 33/40* | (2010.01) |
| *H01L 33/20* | (2010.01) |

(52) U.S. Cl.
CPC .............. *H01L 33/405* (2013.01); *H01L 33/22* (2013.01); *H01L 33/38* (2013.01); *H01L 33/20* (2013.01); *H01L 33/42* (2013.01)

(58) Field of Classification Search
CPC ................................ H01L 33/36; H01L 33/46
USPC ............................................................ 257/98
See application file for complete search history.

(56) References Cited

U.S. PATENT DOCUMENTS

| | | | |
|---|---|---|---|
| 2006/0033113 A1* | 2/2006 | Lee | H01L 33/46 257/80 |
| 2008/0142821 A1* | 6/2008 | Sakamoto | H01L 33/382 257/98 |

(Continued)

FOREIGN PATENT DOCUMENTS

| | | |
|---|---|---|
| JP | 2004-128321 A | 4/2004 |
| JP | 2008-034821 A | 2/2008 |

(Continued)

OTHER PUBLICATIONS

International Search Report from International Application No. PCT/KR2013/011459, Mar. 25, 2014, 2 pages.

*Primary Examiner* — Cuong Q Nguyen
*Assistant Examiner* — Tong-Ho Kim
(74) *Attorney, Agent, or Firm* — Perkins Coie LLP

(57) ABSTRACT

According to the present invention, a light-emitting diode with improved light extraction efficiency comprises: a semiconductor laminated structure including an N-layer, a light-emitting layer, and a P-layer formed on a substrate; an N-type electrode formed on the N-layer; and a P-type electrode formed on the P-layer, wherein the N-type electrode and the P-type electrode include a pad electrode and a dispersion electrode, and the N-type electrode and/or the P-type electrode includes a reflective electrode layer for reflecting light onto the dispersion electrode. Thus, the light-emitting diode has a reflective electrode layer on the electrode so as to improve light extraction efficiency. Further, a reflective layer is patterned beneath a pad unit, thus forming roughness and improving adhesion.

19 Claims, 7 Drawing Sheets

(56) References Cited

U.S. PATENT DOCUMENTS

2011/0278631 A1 11/2011 Shen et al.
2013/0026519 A1* 1/2013 Huang .................. H01L 33/20
257/98

FOREIGN PATENT DOCUMENTS

| JP | 2012-124306 A | 6/2012 |
|----|---------------|--------|
| KR | 10-2012-0018571 A | 3/2012 |

* cited by examiner

LIGHT-EMITTING DIODE WITH IMPROVED LIGHT EXTRACTION EFFICIENCY

PRIORITY CLAIMS AND CROSS-REFERENCES TO RELATED APPLICATIONS

This patent document is a continuation-in-part of, and claims priority and the benefits of, a Patent Cooperation Treaty (PCT) application number PCT/KR2013/011459, entitled "LIGHT-EMITTING DIODE WITH IMPROVED LIGHT EXTRACTION EFFICIENCY" and filed with the Korean Intellectual Property Office (KIPO) on Dec. 11, 2013, which further claims priorities and the benefits of Korean patent application number 10-2012-0146772 entitled "LIGHT-EMITTING DIODE WITH IMPROVED LIGHT EXTRACTION EFFICIENCY" filed with KIPO on Dec. 14, 2012. The contents of each application are incorporated by reference in their entirety.

TECHNICAL FIELD

The present disclosure relates to a light-emitting diode. For example, some implementations of the present disclosure provide a light-emitting diode with an improved light extraction efficiency using a reflector for an electrode structure.

BACKGROUND

Currently, LEDs are applied to various applications including natural color LED display devices, LED traffic signals, white LEDs, and the like. Recently, high-efficiency white LEDs have been expected to replace common fluorescent lamps. Particularly, the efficiency of white LEDs is approaching to the similar level to that of general fluorescent lamps.

In general, a light-emitting diode is formed by growing epitaxial layers on a substrate such as a sapphire substrate, and includes an N-type semiconductor layer, a P-type semiconductor layer, and an active layer interposed therebetween. Meanwhile, an N-type electrode pad is formed on the N-type semiconductor layer and a P-type electrode pad is formed on the P-type semiconductor layer. The light-emitting diode is electrically coupled to an external power source through the electrode pads, and thus is driven. In this case, current flows from the P-type electrode pad to the N-type electrode pad via the semiconductor layers.

SUMMARY

Some embodiments of the disclosed technology are directed to provide a light-emitting diode having an improved light extraction efficiency using a reflective electrode. Some embodiments of the disclosed technology are directed to provide a light-emitting diode having an improved light extraction efficiency, which can prevent a pad electrode exfoliation phenomenon by changing the lower structure of the pad electrode.

In accordance with one aspect of the present invention, a light-emitting diode having an improved light extraction efficiency includes: a semiconductor laminated structure including an N-layer, a light-emitting layer, and a P-layer which are formed on a substrate; an N-type electrode formed on the N-layer; and a P-type electrode formed on the P-layer, wherein the N-type electrode and the P-type electrode include a pad electrode and a dispersion electrode, and at least one of the N-type and P-type electrodes includes a reflective electrode layer configured to reflect light on the dispersion electrode.

The reflective electrode layer may be additionally formed on the pad electrode.

The reflective electrode layer may be formed of a material for reflecting light.

The reflective electrode layer may be formed of any one conductive material selected from the group consisting of Al, Ag, Pt, Pd, Au, Rh, an Al alloy, an Ag alloy, a Pt alloy, a Pd alloy, an Au alloy, and an Rh alloy.

The reflective electrode layer formed on the dispersion electrode may further include: an antioxidant film formed on the reflective electrode layer; and an adhesive layer formed between the antioxidant film and the reflective electrode layer.

The antioxidant film may be formed of a transparent material which prevents the reflective electrode layer from being oxidized.

The antioxidant film may be formed of SiO2.

The adhesive layer may be formed of Ti.

The light-emitting diode may further include a transparent electrode between the dispersion electrode and any one of the P and N-layers.

The light-emitting diode may further include a reflective layer formed between the pad electrode and any one of the P and N-layers.

The reflective layer may be formed in a plurality of layers which are made of two or more reflective materials having different refractive indexes.

The reflective layer may be patterned to form a roughness on a surface thereof, and the pad electrode may be held on any one of the P and N-layers.

The transparent electrode may have a roughness formed on a surface thereof due to the roughness of the reflective layer.

The transparent electrode may cover the reflective layer, and may be disposed between the pad electrode and any one of the N and P-layers.

The transparent electrode may be disposed on an area, except for any one of the N and P-layers exposed through the reflective layer.

The reflective layer may be formed of an insulating material which includes any one selected from the group consisting of SiOx, SiNx, SixNy, SiONx, and TiO2.

The reflective layer may be formed of any one conductive material selected from the group consisting of Al, Ag, Pt, Pd, Au, Rh, an Al alloy, an Ag alloy, a Pt alloy, a Pd alloy, an Au alloy, and an Rh alloy.

According to some embodiments of the disclosed technology, a light-emitting diode is provided with a reflective electrode layer on a dispersion electrode layer, so that the light extraction efficiency can be improved.

In some implementations, since a reflector is patterned on the lower portion of a pad electrode to have a surface roughness, the adhesive force with the pad electrode can be enhanced.

DETAILED DESCRIPTION

Generally, since the P-type semiconductor layer has a high resistivity, electric current is not evenly distributed within the P-type semiconductor layer, and is concentrated on a portion of the P-type semiconductor layer where the P-type electrode pad is formed. The current crowding leads to a reduction in light-emitting area, thereby deteriorating the light-emitting efficiency.

To solve such problems, a technique of deriving current spreading by forming a P-type dispersion electrode which is obtained by expanding the shape of a P-type electrode up to a partial area of a P-type semiconductor layer is used. Since current introduced from the P-type electrode pad is distributed to the P-type dispersion electrode and then is introduced into the P-type semiconductor layer, the light-emitting area of the light-emitting diode can be increased.

To facilitate current spreading within a light-emitting diode, extension portions extending from electrode pads have been used. For example, U.S. Pat. No. 6,650,018, discloses the feature of enhancing current spreading by extending a plurality of extension portions in mutually opposite directions from electrode pads such as electrode contact parts 117 and 127.

When one or more extension portions extending from an electrode pad is used, as described above, the effect of current spreading into a light-emitting diode increases, which can contribute to enhance the efficiency of the light-emitting diode.

Figure 1:
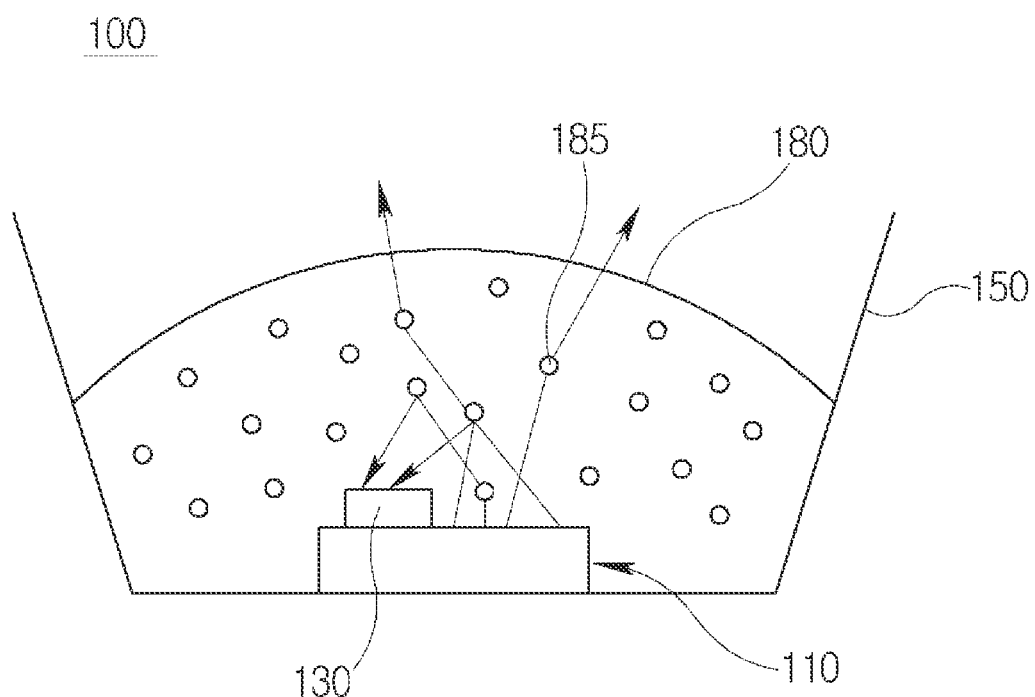
FIG. 1 is a cross-sectional view showing a conventional light-emitting device.

FIG. 1 is a cross-sectional view showing a conventional light-emitting device.

Referring to FIG. 1, a light-emitting device 100 includes a light-emitting diode 110 for emitting light, a mold part 150 for disposing the light-emitting diode 110, and an encapsulation material 180 for encapsulating the light-emitting diode. The encapsulation material 180 is provided with reflection fillers 185 for reflecting light, so that the light efficiency can increase. In addition, an electrode 130 is provided at the upper portion of the light-emitting diode 110.

The electrode 130 is provided with an electrode pad and an extension portion extending from the electrode pad. Here, the electrode 130 is made of a material, such as Au or Cr, having an excellent conductivity for the purpose of current spreading.

However, since the electrode pad and the extension portion extending from the electrode pad are made of a material, such as Au or Cu, having a poor reflection characteristic, a large light loss is caused due to light absorption by the electrode pad and/or the extension portion, and such a light loss acts as a large obstacle in enhancing the light extraction efficiency of the light-emitting diode.

As described above, the electrode 130 formed on the light-emitting diode absorbs or blocks light emitted from the light-emitting diode. Therefore, it is necessary to improve the structure of the electrode so as to enhance the light efficiency of the light-emitting diode.

Hereafter, exemplary embodiments of the disclosed technology will be described in detail with reference to the accompanying drawings. The embodiments to be described below are presented by way of example in an effort to facilitate understanding of various implementations of the disclosed technology. Therefore, the disclosed technology is not limited to the following embodiments and can be embodied in many other forms. In the accompanying drawings, the width, length and thickness of the components may be illustrated on an exaggerated scale for the sake of convenience. It will be understood that when a component is referred to as being "on" or "over" another component, the component may be "directly on" or "directly over" the other component, or intervening components may also be present therebetween. Throughout the specification and the drawings, the same components will be designated by like reference numerals.

First, a light-emitting diode according to embodiments of the disclosed technology will be described with reference to FIGS. 2 to 8. Although the following description will be given on a light-emitting diode including semiconductor, the disclosed technology is not limited thereto, and can be used in light-emitting devices using various lights.

Figure 2:
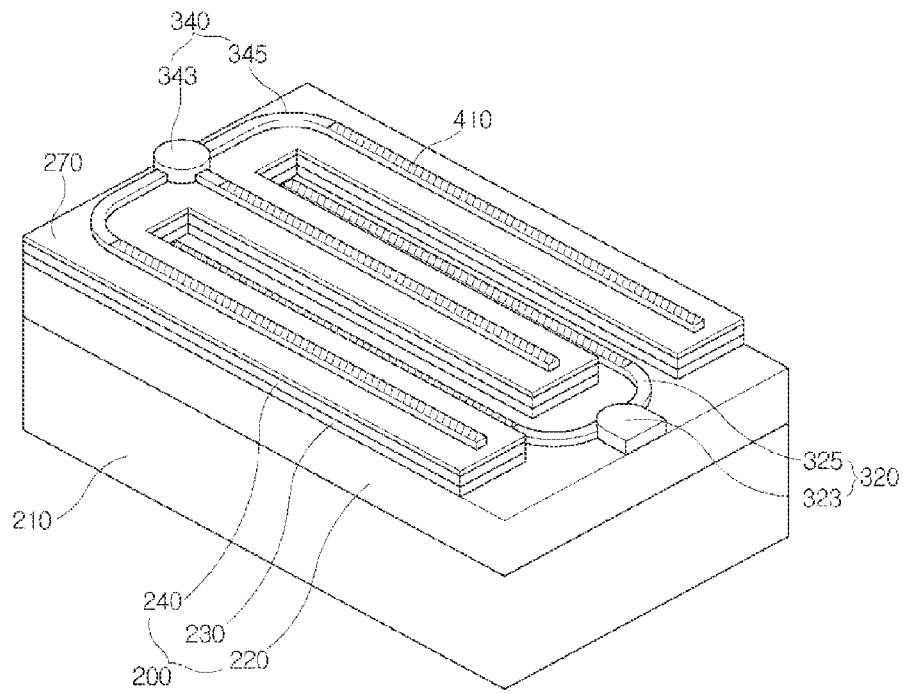
FIG. 2 is a perspective view explaining a light-emitting diode according to an embodiment of the disclosed technology.
Figure 3:
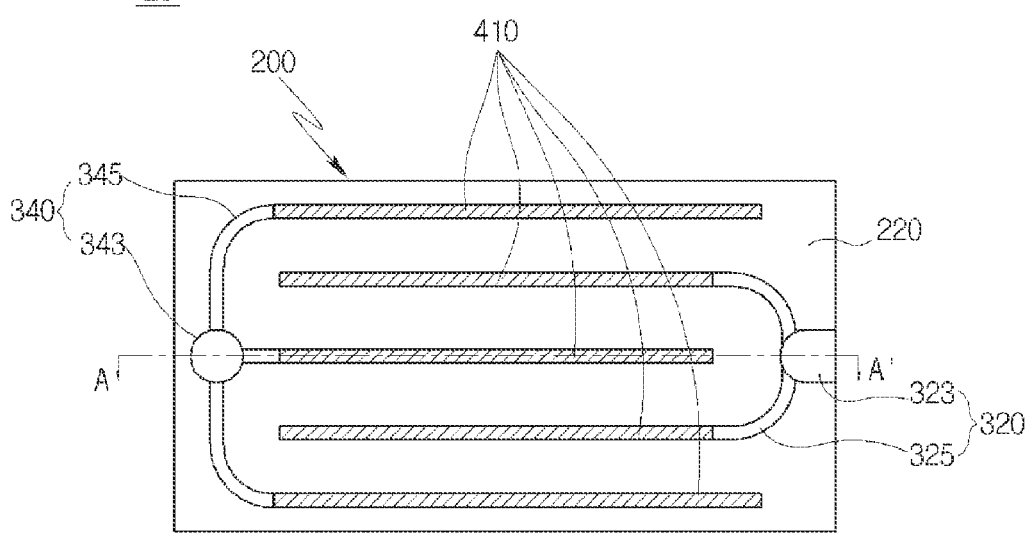
FIG. 3 is a plane view explaining a light-emitting diode according to an embodiment of the disclosed technology.

FIG. 2 is a perspective view explaining a light-emitting diode according to an embodiment of the disclosed technology, and FIG. 3 is a plane view explaining the light-emitting diode according to an embodiment of the disclosed technology.

Referring to FIGS. 2 and 3, a light-emitting diode 20 according to an embodiment of the disclosed technology includes: a semiconductor laminated structure 200 including an N-layer 220, a P-layer 240 and a light-emitting layer 230 on a substrate 210; an N-type electrode 320 formed on the N-layer 220; and a P-type electrode 340 formed on the P-layer 240.

The substrate 210 may be or include an insulating or conductive substrate. The substrate 210 may be made of or include sapphire ($Al_2O_3$), silicon carbide (SiC), zinc oxide (ZnO), silicon (Si), gallium arsenide (GaAs), gallium phosphate (GaP), lithium-alumina ($LiAl_2O_3$), boron nitride (BN), aluminum nitride (AlN) or gallium nitride (GaN), but is not limited thereto. In addition, in order to improve a light extraction efficiency, the substrate 210 may be provided with a light extraction pattern on the surface of the substrate 210.

The N-layer 220 is formed on the substrate 210, the P-layer 240 is positioned on the N-layer 220, and the light-emitting layer 230 is interposed between the N-layer 220 and the P-layer 240, thereby forming the semiconductor laminated structure 200.

The N-layer 220 and the P-layer 240 are III-V-based compound semiconductor layers, for example, (Al, Ga, In)N semiconductor layers. The composition elements and composition ratio of the light-emitting layer 230 may be determined based on the required wavelength of light to be emitted, e.g. ultraviolet light or blue light.

The N-layer 220 and/or the P-layer 240 may be formed in single layers, as shown in the drawings, or may be formed in a multi-layer structure. In addition, the light-emitting layer 230 may have a single quantum well structure or a multi-quantum well structure. In addition, a buffer layer (not shown) may be interposed between the substrate 210 and the N-layer 220. The N-layer 220, light-emitting layer 230, and P-layer 240 of the semiconductor laminated structure 200 may be formed using suitable techniques including an MOCVD or MBE technique.

The P-type electrode 340 is formed on the upper portion of the P-layer 240, and a part of the P-layer 240 is mesa-etched to expose the N-layer 220. The N-type electrode 320 is formed on the exposed N-layer 220. The disposition of the P-type electrode 340 and the N-type electrode 320 have been described above as an example. Other implementations are also possible regarding the disposition of the P-type electrode 340 and the N-type electrode 320. For example, the P-type electrode 340 and N-type electrode 320 may be disposed on the N-layer 220. In some implementations, the lateral surfaces of the semiconductor laminated structures 200 formed through the mesa-etching process may be formed to have a predetermined inclined angle with respect to the surface of the substrate 210.

The light-emitting diode 20 is electrically coupled to an external power source through the electrodes 320 and 340, and thus is driven. In this case, current flows from the P-type electrode 340 to the N-type electrode 320 via the semiconductor laminated structure 200.

Current is supplied through the P-type electrode 340 and N-type electrode 320 and a light-emitting area capable of emitting light can be formed through the light-emitting layer 230.

However, since the P-layer 240 has a high resistivity, current is not evenly distributed within the P-layer 240, and is concentrated on a portion where the P-type electrode 340 is formed, for example, on a pad electrode 343. The current concentration leads to a reduction in light-emitting area, thereby deteriorating the light-emitting efficiency.

Therefore, in order to evenly distribute current, the N-type electrode 320 and the P-type electrode 340 are respectively provided with the N-type dispersion electrode 325 and the P-type dispersion electrode 345 which are extended from the N-type pad electrode 323 and the P-type pad electrode 343 on the N-layer 220 and the P-layer 240, respectively. In this case, the N-type electrode 320 and the P-type electrode 340 may be formed integrally with the N-type dispersion electrode 325 and the P-type dispersion electrode 345 and the N-type pad electrode 323 and the P-type pad electrode 343. In some implementations, a transparent electrode 270 may be additionally formed between the N-type electrode 320 and N-layer 220 and/or P-type electrode 340 and the P-layer 240.

Here, the N-type electrode 320 and the P-type electrode 340 may be made of material, such as gold (Au) or nickel (Ni), having an excellent electric conductivity. Thus, the gold and nickel may absorb light, for example, light emitted from the light-emitting layer 230. Thus, the light extraction efficiency of the light-emitting diode 20 may be deteriorated.

In this case, an area on which the N-type electrode 320 and the P-type electrode 340 can be formed as a non-light-emitting area which blocks light since the N-type electrode 320 and the P-type electrode 340 include metal or the like. Therefore, the N-type electrode 320 and the P-type electrode 340 may cause the light-emitting area to reduce. Despite the reduction of the light-emitting area, however, the light-emitting diode 20 still requires the N-type electrode 320 and the P-type electrode 340 for current supply, and current spreading, etc.

Therefore, some implementations of the light-emitting diode 20 include a reflective electrode layer 410 capable of reflecting emitted light and thus, the light extraction efficiency can be improved. The reflective electrode layer 410 may be formed on each of the N-type electrode 320 and the P-type electrode 340.

In some implementations, the reflective electrode layer 410 may be formed on the N-type pad electrode 323 and P-type pad electrode 343 and the N-type dispersion electrode 325 and the P-type dispersion electrode 345. In some implementations, as shown in FIG. 3, the reflective electrode layer 410 may be formed only on the N-type dispersion electrode 325 and the P-type dispersion electrode 345. For example, since wire bonding is formed in the areas corresponding to the N/P-type pad electrodes 323 the reflective electrode layer 410 needs to be removed from the pad electrodes 323 and 343 when the reflective electrode layer 410 is made of or includes insulating material instead of conductive material.

In some implementations, the reflective electrode layer 410 may include material which can reflect light such as Al, or Ag, or a compound thereof. In some implementations, the reflective electrode layer 410 may be formed to include a plurality of material layers having mutually different refractive indexes and form a reflector having a reflective structure.

As described above, the reflective electrode layer 410 is formed on the N-type electrode 320 and the P-type electrode 340, which are non-light emitting areas, so as to reflect light, so that the light extraction efficiency of the light-emitting diode 20 can be improved.

Figure 4A:
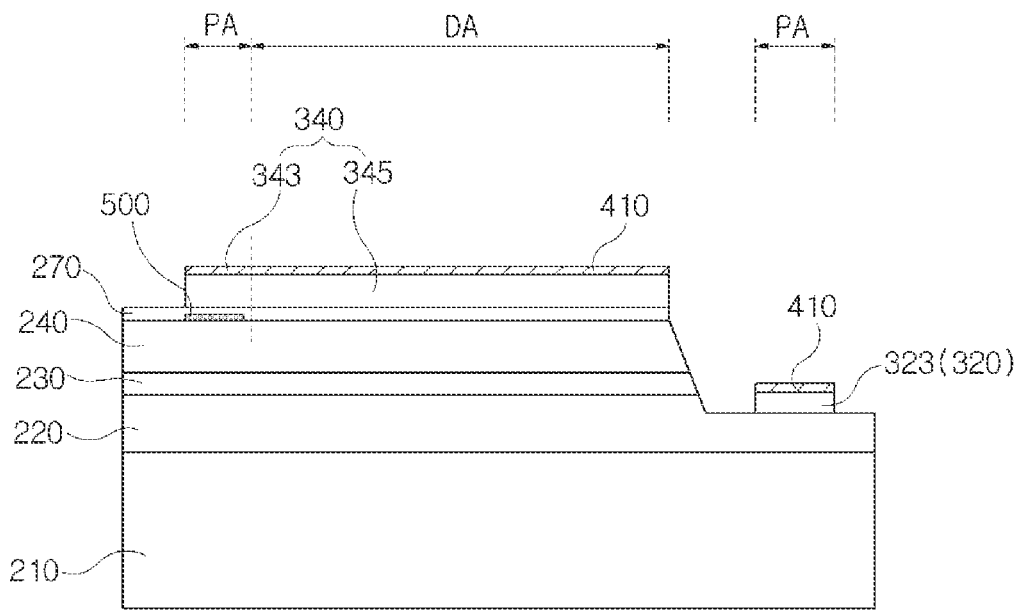
FIG. 4a is a cross-sectional view taken along the A-A' line in FIG. 3.
Figure 4B:
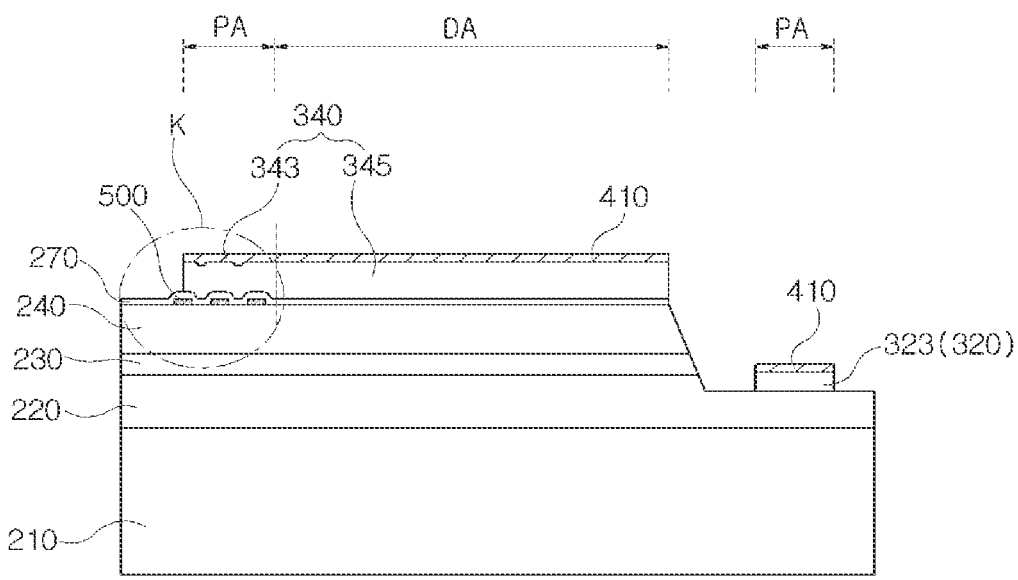
FIG. 4b is a modified cross-sectional view taken along the A-A' line in FIG. 3 according to another embodiment.
Figure 5A:
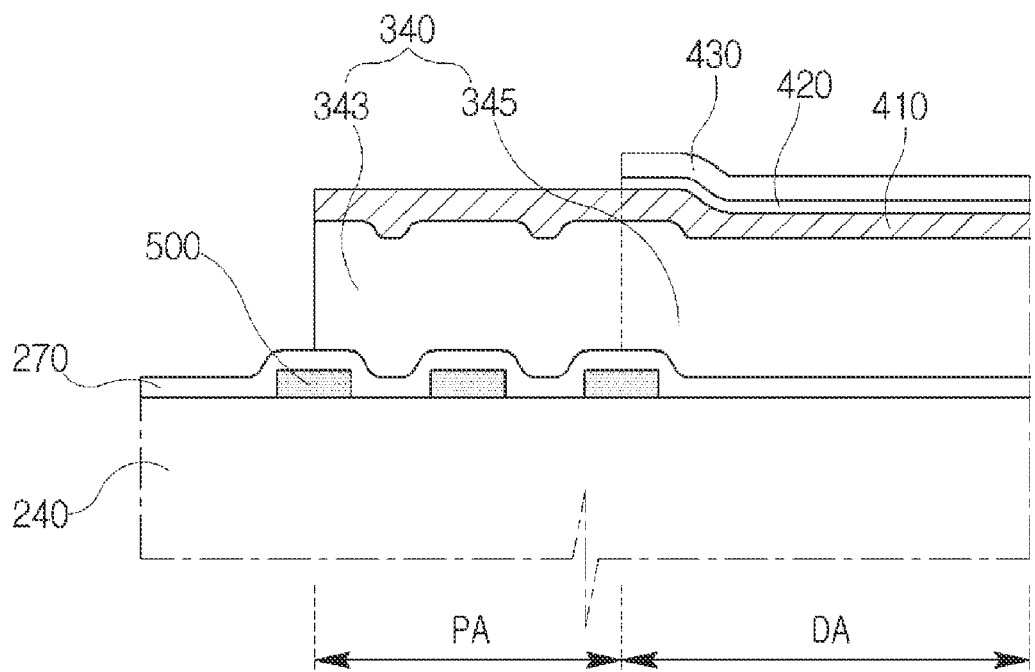
FIGS. 5a and 5b are enlarged views of a region of "K" shown in FIG. 4b.
Figure 5B:
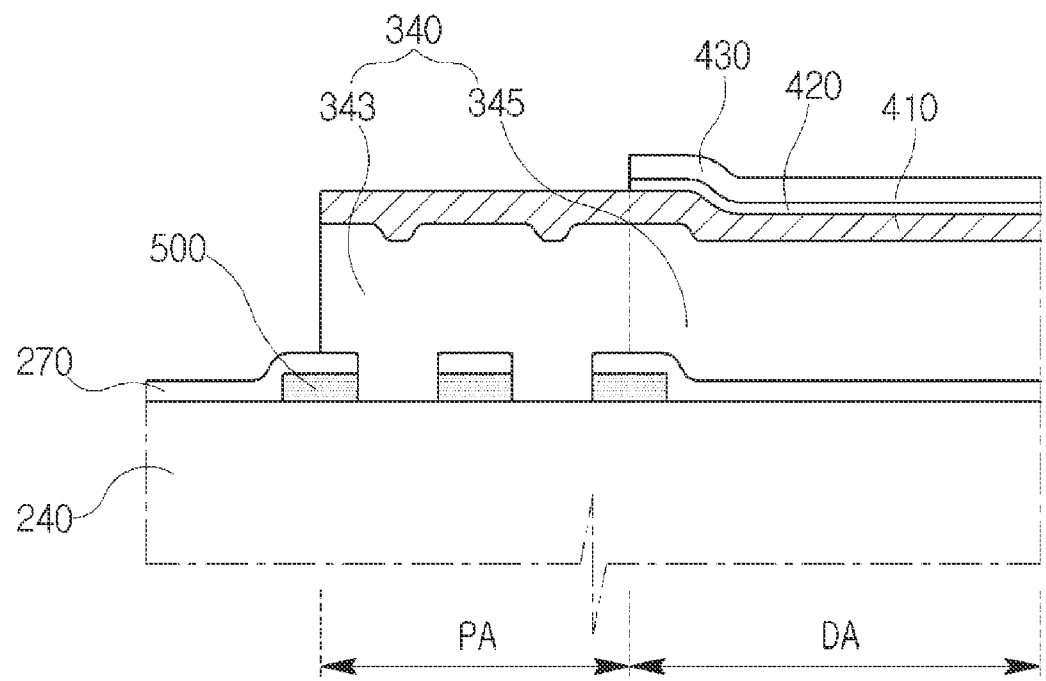

FIG. 4a is a cross-sectional view taken along the A-A' line in FIG. 3, FIG. 4b is a cross-sectional view taken along the A-A' line in FIG. 3 according to another embodiment, and FIGS. 5a and 5b are enlarged views of a region of "K" shown in FIG. 4b.

FIG. 4b differs from FIG. 4a in the lower structure of the pad electrodes, and FIG. 5a differs from FIG. 5b in the structure of the transparent electrode shown. In order to avoid duplicate descriptions, some descriptions for the same elements will be given referring to FIGS. 2 and 3.

Referring to FIGS. 4a and 4b, an N-layer 220, a light-emitting layer 230, and a P-layer 240 are sequentially formed on a substrate 210, thereby forming a semiconductor laminated structure 200. Here, a transparent electrode 270, a P-type electrode 340 and a reflective electrode 410 are formed on the P-layer 240; and an N-type electrode 320 and a reflective electrode layer 410 are formed on the N-layer 220. A transparent electrode 270 may be additionally formed even on the lower portion of the N-type electrode 320. As shown in the drawings, the light-emitting diode 20 may be formed to have a mesa-structure in which a part of the N-layer 220 is exposed by etching a part of the P-layer 240.

The light-emitting diode 20 is supplied with current through the P-type electrode 340 and the N-type electrode 320, thereby forming a light-emitting area capable of emitting light through the light-emitting layer 230 disposed between the P-layer 240 and the N-layer 220.

Although the N-type electrode 320 and the P-type electrode 340 have been described to be formed on the N-layer 220 and the P-layer 240, respectively, other implementations are also possible. The N-type electrode 320 and the P-type electrode 340 may be formed on any one of the N-layer 220 and P-layer 240.

The N-type electrode 320 and the P-type electrode 340 include N-type pad electrode 323 and the P-type pad electrode 343, respectively, which are wire-bonded, and include N-type dispersion electrode 325 and the P-type dispersion electrode 345 extended from the N-type pad electrode 323 and the P-type pad electrode 343. In some implementations, the N-type pad electrode 323 and the P-type pad electrode 343 may be formed integrally with the N-type dispersion electrode 325 and the P-type dispersion electrode 345, respectively, or may be formed separately from the N-type dispersion electrode 325 and the P-type dispersion electrode 345, respectively. As an example, the drawings illustrate the case that the N-type pad electrode 323 and the P-type pad electrode 343 are formed integrally with the N-type dispersion electrode 325 and the P-type dispersion electrode 345, respectively. The drawings further illustrate that the N-type dispersion electrode 325 and the P-type dispersion electrode 345 have the same height and the N-type pad electrode 323 and the P-type pad electrode 343 have the same height.

For convenience of description, an area on which the N-type pad electrode 323 and the P-type pad electrode 343 are formed will be referred to as a pad part PA, and an area on which the N-type dispersion electrode 325 and the P-type dispersion electrode 345 are formed will be referred to as a dispersion part DA. Here, the N-type pad electrode 323 and the P-type pad electrode 343 formed on the pad part PA function as a bonding pad for bonding wire, and has a relatively greater area than the N-type dispersion electrode 325 and the P-type dispersion electrode 345 that are formed on the dispersion part DA to facilitate the wire bonding.

Hereinafter, the pad part PA and the dispersion part DA will be separately described. The N-type electrode 320 and the P-type electrode 340 will be referred to as electrodes 320 and 340, the N-type pad electrode 323 and the P-type pad electrode 343 will be referred to as pad electrodes 323 and 343, the N-type dispersion electrode 325 and the P-type dispersion electrode 345 will be referred to as dispersion electrodes 325 and 345, and the N-type and the P-type will be specified only when the one of N-type or the P-type is specifically mentioned.

The dispersion part DA is provided with an antioxidant film 430 and an adhesive layer 420 that are additionally formed, while the pad part PA is provided with a reflective layer 500 disposed on the lower portions of the pad electrodes 323 and 343.

In the dispersion part DA, a transparent electrode 270 is formed on the N-layer 220 and the P-layer 240, and dispersion electrodes 325 and 345 are formed on the transparent electrode 270. Then, a reflective electrode layer 410 is formed on the dispersion electrodes 325 and 345.

The reflective electrode layer 410 may be configured with or include any one of Al, Ag, or a compound thereof, which can reflect light. In addition, the reflective electrode layer 410 may be formed to include a plurality of material layers having mutually different refractive indexes and form a reflector having a reflective structure.

When the reflective electrode layer 410 is configured with or include any one of Al, Ag, or a compound thereof, which can reflect light, the reflective electrode layer 410 may be formed by forming the dispersion electrodes 325 and 345 using, for example, E-beam and then successively depositing Al and Ag metals.

In some implementations, the reflective electrode layer 410 may be formed using a plating method, and may be formed using the electrolysis method or the electroless method. In some implementations, the reflective electrode layer 410 may be formed using the electroless method directly after the electrodes 320 and 340 are formed using the electroless method. When the electrolysis method is used, the electrodes 320 and 340 and the reflective electrode layer 410 may be formed at the same time by forming a dispersion electrode material, plating a reflective electrode material while not removing a photoresist (PR), and removing the photoresist after planting a reflective electrode material.

In some implementations, the reflective electrode layer 410 may be formed to include mutually different materials on the electrodes 320 and 340. A reflector can be formed to include material layers having mutually different refractive indexes. The reflector may be used as the reflective electrode layer 410 by using a conductive material.

A distributed Bragg reflector (DBR) may be used for the reflective electrode layer 410. The DBR may be formed by alternately stacking two or more insulating layers or conductive layers having mutually different refractive indexes.

When the reflective electrode layer 410 is formed with the DBR, a conductive material having reflectivity can be used for the reflective electrode layer 410. In some implementations, the conductive material to be used for the reflective electrode layer 410 may include Al, Ag, Pt, Pd, Au, Rh, an Al alloy, an Ag alloy, a Pt alloy, a Pd alloy, an Au alloy, or an Rh alloy.

In some implementations, an insulating material to be used for the reflective electrode layer 410 may be selected from the group consisting of or include SiOx, SiNx, SixNy or SiONx. For example, the formation may be achieved through the chemical vapor deposition or the sputtering. In this case, when an insulating material is used for the reflective electrode layer 410, the reflective electrode layer 410 formed on the pad electrodes 323 and 343 must be removed.

On the dispersion electrodes 325 and 345 formed in the dispersion part DA, as described above, the reflective electrode layer 410, the adhesive layer 420 and the antioxidant film 430 are sequentially formed. In this case, the antioxidant film 430 may cover the lateral surfaces or sides of the adhesive layer 420, the reflective electrode layer 410, and dispersion electrodes 325 and 345, which have been exposed.

Since the reflective electrode layer 410 is formed with metal, the reflective electrode layer 410 may be oxidized by heat radiated from the light-emitting diode 20. In order to prevent such oxidization, an antioxidant film 430 may be formed on the reflective electrode layer 410. The antioxidant film 430 is made of or includes transparent material which light generated from the light-emitting layer 230 can transmit but is not limited to an insulating layer, and may be formed, for example, with $SiO_2$.

Since the antioxidant film 430 and the reflective electrode layer 410 may be made of materials having low adhesion, the two layers may be exfoliated or separated from each other. Therefore, an adhesive layer 420 for improving the adhesion may be formed between the antioxidant film 430 and the reflective electrode layer 410. The adhesive layer 420 may be formed with Ti or the like.

The antioxidant film 430 and the adhesive layer 420 are not formed on the pad electrodes 323 and 343, which have been formed in the pad part PA. This is because the pad part PA is an area to which wire is to be bonded, and an insulating material such as the antioxidant film 430 must be removed from the pad part so that a bonding material can be formed on the pad part in the future.

Meanwhile, the pad part PA further includes a reflective layer 500, which is formed with a reflector, on the lower portions of the pad electrodes 323 and 343.

In the pad part PA, the reflective electrode layer 410 is formed on the electrodes 320 and 340. A transparent electrode 270 may be formed between the N-type electrode 320 or the P-type electrode 340 and the N-layer 220 or the P-layer 240. In some implementations, the transparent electrode 270 may not be formed on the N-layer 220.

On the P-layer 240, the transparent electrode 270 may be positioned to form ohmic-contact with the P-layer 240. It is difficult to evenly distribute current on the P-layer 240 having a high resistivity. Moreover, although current is distributed to the dispersion electrodes 325 and 345, the current may be concentrated on the edge portions of the dispersion electrodes 325 and 345. For this reason, a transparent electrode 270 which can evenly distribute current and transmit light is formed between the P-layer 240 and the P-type electrode 340. In some implementations, the transparent electrode 270 may be formed between the N-type electrode 320 and the N-layer 220.

When the P-type electrode 340 and the P-layer 240 are contacted with each other, it is difficult to form an ohmic-contact because the P-layer 240 has a high resistivity. Therefore, the transparent electrode 270 may be formed between the P-type electrode 340 and the P-layer 240 so that the two elements can form ohmic-contact.

In some implementations, the transparent electrode 270 may be formed to include indium-tin-oxide (ITO). As described above, current introduced from the P-type electrode 340 is distributed to the transparent electrode 270 and then to the P-layer 240, so that the light-emitting area of the light-emitting diode 20 can increase.

In some implementations, the reflective electrode layer 410 formed on the transparent electrode 270 is formed on the pad electrodes 323 and 343 and the dispersion electrodes 325 and 345, wherein the pad electrodes 323 and 343 correspond to wire-bonding area which are configured as non-light-emitting areas. Therefore, although the reflective electrode layer 410 is formed on the transparent electrode 270, as in the dispersion part DA, the reflective electrode layer 410 cannot perform a reflective function due to wire bonding.

Thus, some implementations of the disclosed technology provide a reflective layer 500 that is additionally provided on the lower portions of the pad electrodes 323 and 343, thereby increasing the light extraction area and improving the light extraction efficiency.

In some implementations, the reflective layer 500 may be formed with or include a DBR (Distributed Bragg Reflector). The DBR may be formed by repeatedly stacking material layers having mutually different refractive indexes and performing a patterning by a photo-etching process, or may be formed by alternately stacking two or more layers having mutually different refractive indexes. The DBR may be formed on a non-light-emitting area for the purpose of improving a reflection characteristic.

As illustrated in FIG. 5b, a pattern may be formed in the pad part PA so as to improve the adhesion of the pad electrodes 323 and 343. When a DBR is formed as the pattern, a roughness is formed on the transparent electrode 270 formed on the reflective layer 500, so that the adhesion between the pad electrodes 323 or 343 and the transparent electrode 270 can be improved. In addition, the transparent electrode 270 on which a roughness is formed can improve the light extraction efficiency due to the roughness of the transparent electrode 270.

Figure 6A:
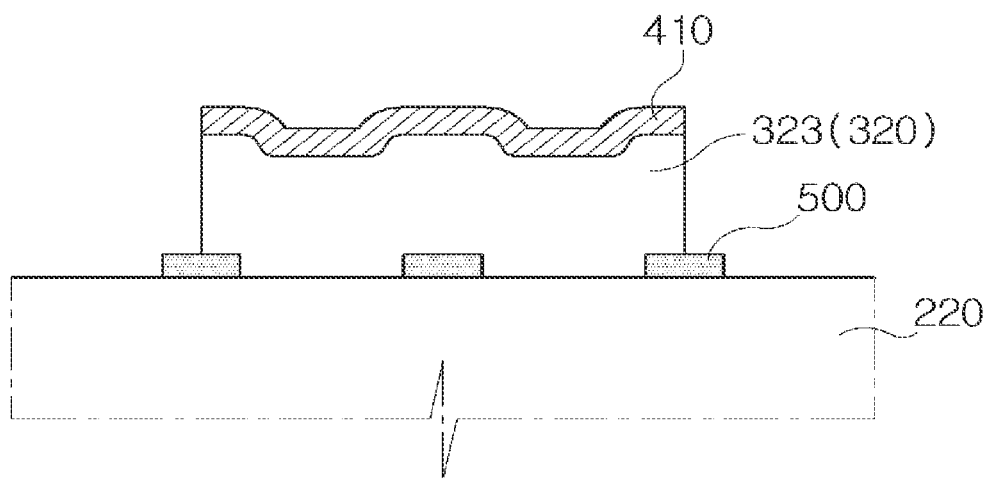
FIGS. 6a and 6b are views illustrating pad parts according to other embodiments of the disclosed technology.
Figure 6B:
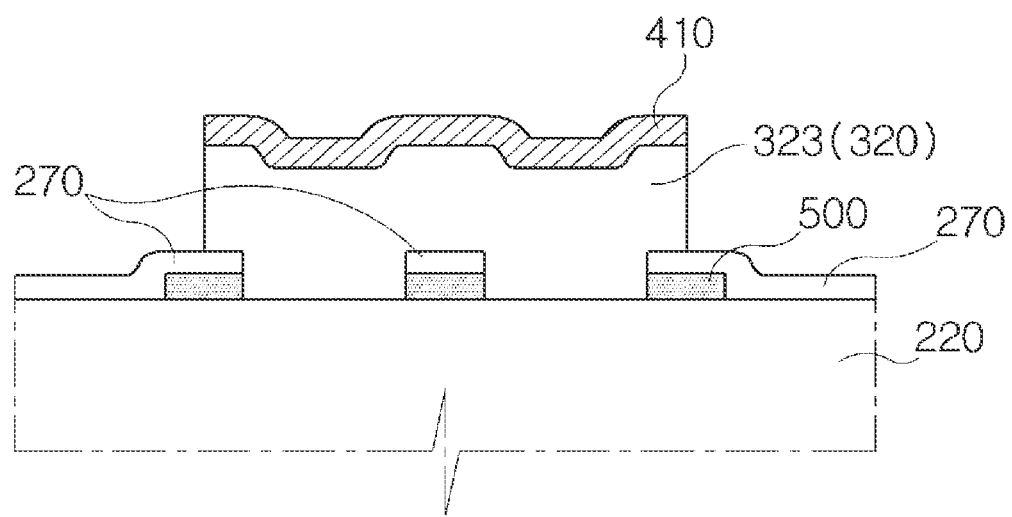
Figure 7:
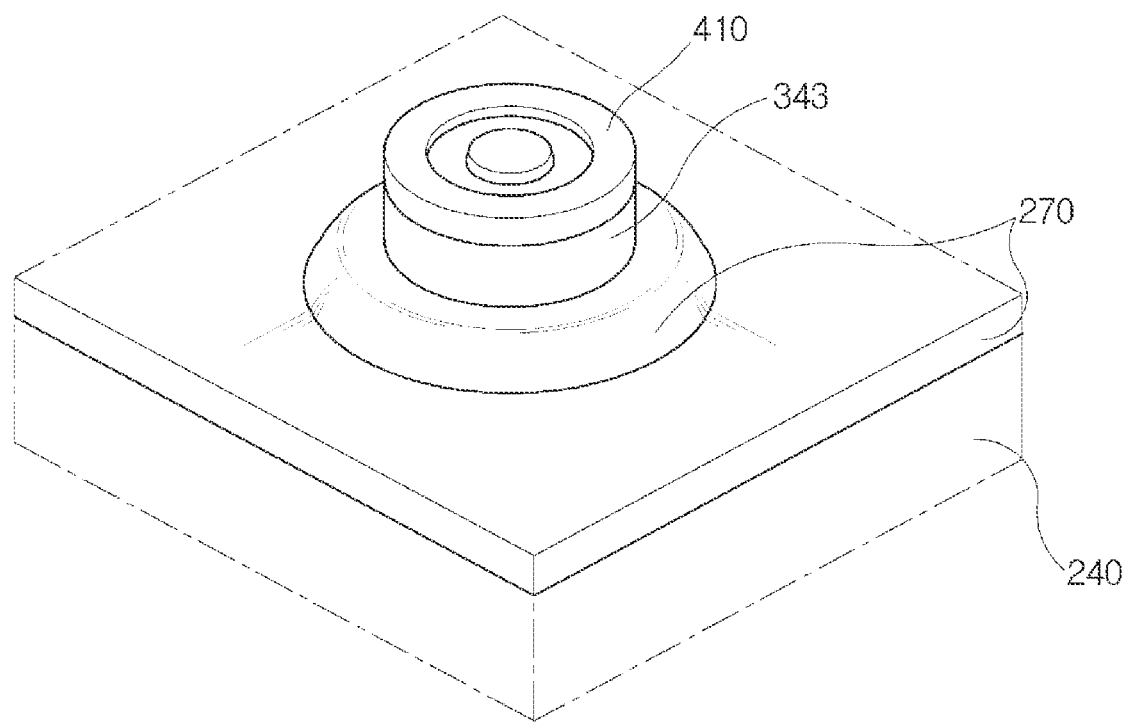
FIG. 7 is a perspective view illustrating a pad part formed in a light-emitting diode according to the disclosed technology.

FIGS. 6a and 6b are views illustrating pad parts according to other embodiments of the disclosed technology, and FIG. 7 is a perspective view illustrating a pad part formed in a light-emitting diode according to the disclosed technology.

FIGS. 6a to 7 are cross-sectional views illustrating pad parts of a light-emitting diode according to other implementations of the disclosed technology. Here, although a pad electrode will be exemplary described as an N-type pad electrode, the N-type pad electrode and the P-type pad electrode can be formed in the similar manner. In order to avoid duplicate description, some of the following description will be given referring to FIGS. 2 and 5b.

FIGS. 6a to 7 illustrate difference structures of the transparent electrode 270 formed at the lower portions of the pad electrodes 323 and 343. In some implementations, a reflective electrode layer 410 may be selectively formed on the upper portions of the pad electrodes 323 and 343.

First, a reflective layer 500 is formed at the lower portions of the pad electrodes 323 and 343 to be contacted with a P-layer 240.

The reflective layer 500 may be formed with or include a DBR (Distributed Bragg Reflector). The DBR may be formed by repeatedly stacking material layers having mutually different refractive indexes and performing a patterning by a photo-etching process, or by alternately stacking two or more layers having mutually different refractive indexes. The distributed Bragg reflector (DBR) is used when a high reflexibility is required in various light-emitting devices which have a light-emitting function, a light detection function, or a light modulation function, and the like.

The DBR is or includes a reflecting mirror which is configured to reflect light using a difference in refractive index by alternately stacking two types of media having mutually different refractive indexes. An insulating material to be used as the reflective layer 500 may be selected from the group consisting of or include, for example, SiOx, SiNx, SixNy, or SiONx. For example, the DBR may be formed through the chemical vapor deposition or the sputtering. Alternately, like the reflective electrode layer 410, a DBR configured with a conductive material may be used.

A reflective layer may be formed on the N-layer and the P-layer. In addition, a pad electrode is formed on the reflective layer, wherein a transparent electrode may be disposed between the reflective layer and the pad electrode. In some implementations, the transparent electrode may not be formed.

A transparent electrode 270 may be formed after a reflective layer 500 is formed. However, other implementations are also possible. For example, a reflective layer may be formed after a transparent electrode 270 is formed.

As illustrated in FIG. 6b, after a reflective layer 500 is formed, a transparent electrode is formed. The transparent electrode 270 and the reflective layer 500 may be patterned through a patterning process.

The reflective layer 500 and transparent electrode 270, which have been pattern as described above, form a roughness on the surface of the transparent electrode 270. Therefore, the pad electrodes 323 and 343 formed on the transparent electrode 270 having a roughness can improve the adhesion between the transparent electrode 270 and the pad electrodes 323 and 343.

In some implementations, the dispersion electrode layers 320 and 340 in the pad part PA may be held by the internal reflective layer 500. The reflective layer 500 may be formed at the lower portion of the pad electrode 343 to have a plurality of ring shapes so as to hold the pad electrode 343. Since the adhesion between the pad electrode 343 and the P-layer 240 is improved due to the reflective layer 500, the pad electrode 343 can be prevented from being exfoliated or separated.

In some implementations, the transparent electrode 270 formed around the dispersion electrodes 320 and 340 is configured to have a grip structure for holding the dispersion electrodes 320 and 340 from an exterior, and thus, the adhesion can be more improved.

Accordingly, the adhesion between the pad electrode 343 and the P-layer 240 is improved, thereby reducing a phenomenon that the pad electrode 343 is exfoliated or separated when wire bonding is formed on the pad electrode 343.

Figure 8:
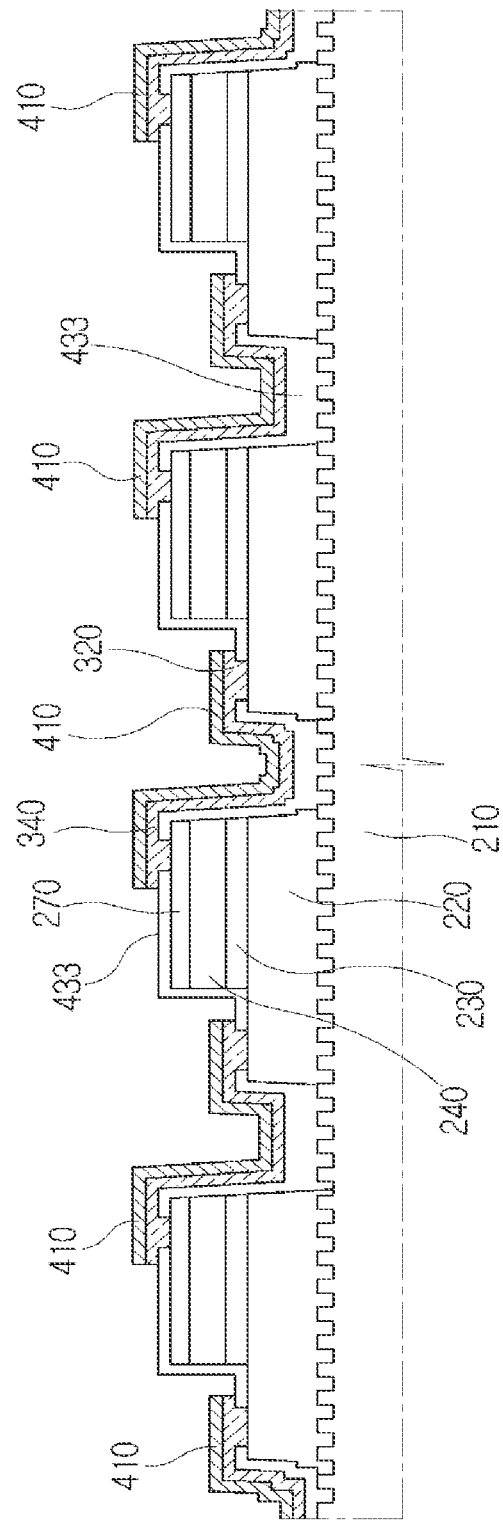
FIG. 8 is a cross-sectional view illustrating a light-emitting diode according to another embodiment of the disclosed technology.

FIG. 8 is a cross-sectional view illustrating a light-emitting diode according to another embodiment of the disclosed technology. Here, in order to avoid duplicate description, some of the following description will be given referring to FIGS. 2 and 7. Here, while FIG. 2 illustrates a light-emitting diode configured in a mesa structure, FIG. 8 explains a light-emitting diode configured in an Acrich structure.

Referring to FIG. 8, a plurality of semiconductor laminated structures 200 are formed on a substrate 210.

First, in order to improve the light extraction efficiency of the surface of the substrate 210, a pattern is formed on the surface of the substrate 210. In this case, the pattern of the substrate may be formed by etching the surface of the substrate, or may be formed by patterning a light extraction pattern on the substrate.

A semiconductor laminated structure 200 is formed by sequentially stacking an N-layer 220, a light-emitting layer 230, and a P-layer 240. Here, the N-layer 220 is exposed by etching a part of the P-layer 240 and light-emitting layer 230. In addition, an insulating layer 433 is formed on the entire surface of the semiconductor laminated structure 200. The insulating layer 433 may be formed with $SiO_2$ or the like.

A part of the insulating layer 433 is etched, and an area exposed by etching the insulating layer 433 corresponds to an area on which electrodes 320 and 340 are to be formed. An electrode material is formed on the insulating layer 433 and the area exposed through the insulating layer 433 to form electrodes 320 and 340. The N-type electrode 320 and the P-type electrode 340 may be formed to be connected to each other.

In addition, a reflective electrode layer 410 is formed on the electrodes 320 and 340. As described above, the reflective electrode layer 410 is formed with a material which reflects light, and may be formed in a pad part PA or a dispersion part DA. In some implementations, the reflective electrode layer 410 may not be formed in the pad part PA.

In some implementations, an antioxidant film (see FIG. 5a) for preventing oxidation is formed on the reflective electrode layer 410, and an adhesive layer 420 (see FIG. 5a) is formed between the antioxidant film (see FIG. 5a) and the reflective electrode layer 410.

As described above, according to implementations of the disclosed technology, the light-emitting diode 20 is formed in an Acrich structure, and the reflective electrode layer 410 is formed on the electrodes 320 and 340, thereby improving the light extraction efficiency.

The disclosed technology can be applied to various implementations including a light-emitting diode which can be used in various applications, such as natural color LED display devices, LED traffic signals, or white LEDs, and the like.

Only a few embodiments, implementations and examples are described and other embodiments and implementations, and various enhancements and variations can be made based on what is described and illustrated in this document.

What is claimed is:

1. A light-emitting diode with an improved light extraction efficiency, comprising:
    a semiconductor laminated structure including an N-layer, a light-emitting layer, and a P-layer which are formed on a substrate;
    an N-type electrode formed on the N-layer including a pad electrode and a dispersion electrode that are adjacent each other in a horizontal direction;
    a P-type electrode formed on the P-layer including a pad electrode and a dispersion electrode that are adjacent each other in a horizontal direction; and
    a reflective electrode layer formed over the N-type electrode and the P-type electrode and configured to reflect light on the dispersion electrode,
    wherein the light-emitting diode further comprises a reflective layer formed between the pad electrode and at least one of the P and N-layers, and
    wherein the reflective layer is patterned to form a roughness on a surface thereof, and the pad electrode is held on any one of the P and N-layers.

2. The light-emitting diode according to claim 1, wherein the reflective electrode layer is additionally formed on the pad electrode.

3. The light-emitting diode according to claim 1, wherein the reflective electrode layer includes a material for reflecting light.

4. The light-emitting diode according to claim 1, wherein the reflective electrode layer includes a conductive material.

5. The light-emitting diode according to claim 4, wherein the conductive material of the reflective electrode includes Al, Ag, Pt, Pd, Au, Rh, an Al alloy, an Ag alloy, a Pt alloy, a Pd alloy, an Au alloy, or an Rh alloy.

6. The light-emitting diode according to claim 1, wherein the reflective electrode layer formed on the dispersion electrode further comprises:
    an antioxidant film formed on the reflective electrode layer; and
    an adhesive layer formed between the antioxidant film and the reflective electrode layer.

7. The light-emitting diode according to claim 6, wherein the antioxidant film includes a transparent material to prevent the reflective electrode layer from being oxidized.

8. The light-emitting diode according to claim 6, wherein the antioxidant film includes $SiO_2$.

9. The light-emitting diode according to claim 6, wherein the adhesive layer includes Ti.

10. The light-emitting diode according to claim 1, further comprising a transparent electrode disposed between the dispersion electrode and any one of the P and N-layers.

11. The light-emitting diode according to claim 1, wherein the reflective layer is formed in a plurality of layers which are made of two or more reflective materials having different refractive indexes.

12. The light-emitting diode according to claim 10, wherein the transparent electrode has a roughness formed on a surface thereof due to the roughness of the reflective layer.

13. The light-emitting diode according to claim 10, wherein the transparent electrode covers the reflective layer, and is disposed between the pad electrode and any one of the N and P-layers.

14. The light-emitting diode according to claim 10, wherein the transparent electrode is disposed on an area, except for any one of the N and P-layers exposed through the reflective layer.

15. The light-emitting diode according to claim 1, wherein the reflective layer includes an insulating material.

16. The light-emitting diode according to claim 15, wherein the insulating material of the reflective layer includes SiOx, SiNx, SixNy, SiONx, or $TiO_2$.

17. The light-emitting diode according to claim 1, wherein the reflective layer includes a conductive material.

18. The light-emitting diode according to claim 17, wherein the conductive material of the reflective layer includes Al, Ag, Pt, Pd, Au, Rh, an Al alloy, an Ag alloy, a Pt alloy, a Pd alloy, an Au alloy, or an Rh alloy.

19. The light-emitting diode according to claim 1, wherein the reflective layer is formed over only a portion of at least one of the P and N-layers such that the reflective layer is positioned under the pad electrode of at least one of the P-type electrode and N-type electrode except a region under the dispersion electrode of at least one of the P-type electrode and N-type electrode.

* * * * *